(12) United States Patent
Forrest et al.

(10) Patent No.: US 9,978,968 B2
(45) Date of Patent: May 22, 2018

(54) PHOTOVOLTAIC CELLS WITH A GRADED ACTIVE REGION ACHIEVED USING STAMP TRANSFER PRINTING

(71) Applicants: The Regents of the University of Michigan, Ann Arbor, MI (US); Industry-Academic Cooperation Foundation, Dankook University, Gyeongii-do (KR)

(72) Inventors: Stephen R. Forrest, Ann Arbor, MI (US); Jun Yeob Lee, Gyeonggi-do (KR); Yong Joo Cho, Seoul (KR)

(73) Assignees: The Regents of the University of Michigan, Ann Arbor, MI (US); Industry-Academic Cooperation Foundation, Dankook University, Gyeonggi-Do (KR)

(*) Notice: Subject to any disclaimer, the term of this patent is extended or adjusted under 35 U.S.C. 154(b) by 0 days. days.

(21) Appl. No.: 15/030,136

(22) PCT Filed: Oct. 27, 2014

(86) PCT No.: PCT/US2014/062345
§ 371 (c)(1),
(2) Date: Apr. 18, 2016

(87) PCT Pub. No.: WO2015/061770
PCT Pub. Date: Apr. 30, 2015

(65) Prior Publication Data
US 2016/0260917 A1    Sep. 8, 2016

Related U.S. Application Data

(60) Provisional application No. 61/895,834, filed on Oct. 25, 2013.

(51) Int. Cl.
*H01L 51/42* (2006.01)
*H01L 51/00* (2006.01)

(52) U.S. Cl.
CPC .......... *H01L 51/424* (2013.01); *H01L 51/003* (2013.01); *H01L 51/0003* (2013.01);
(Continued)

(58) Field of Classification Search
CPC .................................................. H01L 51/0003
See application file for complete search history.

(56) References Cited

U.S. PATENT DOCUMENTS

2010/0294351 A1    11/2010  Holmes et al.
2011/0250718 A1*   10/2011  Loo ........................ B82Y 10/00
                                                           438/82
2016/0260917 A1*    9/2016  Forrest ................ H01L 51/0004

FOREIGN PATENT DOCUMENTS

WO    WO 2011/112714    9/2011

OTHER PUBLICATIONS

International Search Report and Written Opinion dated Feb. 24, 2015, PCT/US2014/082345.
(Continued)

*Primary Examiner* — Caridad Everhart
*Assistant Examiner* — Ankush Singal
(74) *Attorney, Agent, or Firm* — Finnegan, Henderson, Farabow, Garrett & Dunner, LLP

(57) ABSTRACT

Disclosed herein are processes for fabricating organic photosensitive optoelectronic devices with a vertical compositionally graded organic active layer. The processes use either a single-stamp or double-stamp printing technique to transfer the vertical compositionally graded organic active layer from a starting substrate to a device layer.

36 Claims, 7 Drawing Sheets

(52) U.S. Cl.
CPC ...... *H01L 51/0004* (2013.01); *H01L 51/4253* (2013.01); *H01L 51/0034* (2013.01); *H01L 51/0036* (2013.01); *H01L 51/0047* (2013.01); *H01L 51/0094* (2013.01); *H01L 2251/303* (2013.01); *Y02E 10/549* (2013.01)

(56) References Cited

OTHER PUBLICATIONS

Wang et al., "Photovoltaic Devices with an Active Layer from a Stamping Transfer Technique: Single Layer Versus Double Layer," *Langmuir*, vol. 26, No. 12, pp. 9584-9588, Mar. 19, 2010.
Wang et al., "Unexpected solid-solid intermixing in a bilayer of poly(3-hexylthiophene) and [6,6]-phenylC61-butyric acidmethyl ester via stamping transfer," *Organic Electronics*, vol. 11, No. 8, pp. 1376-1380, Jun. 2, 2010.
Huang et al., "Fabrication of multilayer organic solar cells through a stamping technique," *Journal of Materials Chemistry*, vol. 19, No. 24, p. 4077, May 7, 2009.

\* cited by examiner

Control device · Printed device (a)

(b)

PHOTOVOLTAIC CELLS WITH A GRADED ACTIVE REGION ACHIEVED USING STAMP TRANSFER PRINTING

STATEMENT REGARDING FEDERALLY SPONSORED RESEARCH

This invention was made with U.S. Government support under Contract No. DE-SC000957 awarded by the U.S. Department of Energy. The government has certain rights in the invention.

CROSS-REFERENCE TO RELATED APPLICATIONS

This application claims the benefit of U.S. Provisional Application No. 61/895,834 filed Oct. 25, 2013, which is incorporated herein by reference in its entirety.

JOINT RESEARCH AGREEMENT

The subject matter of the present disclosure was made by, on behalf of, and/or in connection with one or more of the following parties to a joint university-corporation research agreement: The Regents of the University of Michigan and Nanoflex Power Corporation. The agreement was in effect on and before the date the subject matter of the present disclosure was prepared, and was made as a result of activities undertaken within the scope of the agreement.

The present invention generally relates to electrically active, optically active, solar, and semiconductor devices and, in particular, to processes for fabricating organic photosensitive optoelectronic devices.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, FF.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, FF, defined as:

$$FF=\{I_{max}V_{max}\}/\{I_{SC}V_{OC}\} \quad (1)$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = FF*(I_{SC}*V_{OC})/P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies, also known as the HOMO-LUMO gap. The Fermi energy characterizes the statistical occupation of molecular quantum energy states denoted by the value of energy for which the probability of occupation is equal to ½. A Fermi energy near the conduction band minimum (LUMO) energy indicates that electrons are the predominant carrier. A Fermi energy near the valence band maximum (HOMO) energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. In some cases, an acceptor material may be an ETL and a donor material may be an HTL.

Conventional inorganic semiconductor PV cells may employ a p-n junction to establish an internal field. However, it is now recognized that in addition to the establishment of a p-n type junction, the energy level offset of the heterojunction also plays an important role.

The energy level offset at the organic donor-acceptor (D-A) heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Carrier generation requires exciton generation, diffusion, and ionization or collection. There is an efficiency $\eta$ associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D$~50 Å) than the optical absorption length (~500 Å), requiring a tradeoff between using a thick, and therefore resistive, cell with multiple or highly folded interfaces, or a thin cell with a low optical absorption efficiency.

Organic PV cells have the potential for low cost and efficient harvesting of solar energy due to their light weight, flexibility when deposited onto thin substrates, and low energy fabrication processes.

Recently, polymer-based organic photovoltaic cells (OPVs) have attracted attention as the next generation of solar energy conversion devices due to their potential for high power conversion efficiencies (PCE) and simple, low-cost fabrication processes. In these devices, uniform mixtures of donor and acceptor materials may be used to form mixed heterojunction organic PV cells. These cells benefit from a high exciton diffusion efficiency, but suffer from low charge collection efficiency. Studies have shown that to improve charge collection efficiency, the concentrations of donor and acceptor materials may vary across the mixed photoactive layer forming a graded heterojunction to provide paths for charge carrier extraction. As known in the art, in a graded heterojunction, the concentration of a donor material is maximum at a first side of the mixed photoactive layer and decreases in the direction of the opposite side, while the concentration of an acceptor material is maximum at the opposite side and decreases in the direction of the first side. This allows for a donor-rich composition near the anode and an acceptor-rich composition near the cathode. Because of the improved charge collection efficiency in a graded heterojunction device, the device performance improves.

The present inventors have achieved a vertical compositional gradient in a mixed donor-acceptor active layer using a stamp transfer printing process. For example, it has been demonstrated that the stamp transfer printing of P3HT:PCBM spin-coated on a hydrophilic Si wafer surface enhances the PCE of polymer OPVs by ~25% (to PCE=3.7±0.2%) due to compositional grading of the active layer. Stamping and material transfer may ultimately be a practical means for low cost manufacturing environments based on roll-to-roll processing or other high capacity techniques of organic OPVs over large and flexible substrate areas.

In a first aspect, a single-stamp transfer process is disclosed for fabricating an organic photosensitive optoelectronic device. The process comprises providing a compositionally graded organic active layer disposed on a substrate surface, wherein the organic active layer comprises at least one donor material and at least one acceptor material and has an exposed surface; contacting a stamp with the exposed surface of the active layer under conditions sufficient to attach the stamp to the exposed surface of the active layer; separating the active layer from the substrate using the stamp, wherein the separation exposes a lifted-off surface of the active layer; contacting the lifted-off surface of the active layer with a device layer under conditions sufficient to attach the active layer to the device layer; and separating the active layer from the stamp.

In a second aspect, a double-stamp transfer process is disclosed for fabricating an organic photosensitive optoelectronic device. The process comprises providing a compositionally graded organic active layer disposed on a substrate surface, wherein the organic active layer comprises at least one donor material and at least one acceptor material and has an exposed surface; contacting a first stamp with the exposed surface of the active layer under conditions sufficient to attach the first stamp to the exposed surface of the active layer; separating the active layer from the substrate using the first stamp, wherein the separation from the substrate exposes a first lifted-off surface of the active layer; contacting a second stamp with the first lifted-off surface of the active layer under conditions sufficient to attach the second stamp to the first-lifted-off surface of the active layer; separating the active layer from the first stamp using the second stamp, wherein the separation from the first stamp exposes a second lifted-off surface of the active layer; contacting the second lifted-off surface of the active layer with a device layer under conditions sufficient to attach the active layer to the device layer; and separating the active layer from the second stamp.

The accompanying figures are incorporated in, and constitute a part of this specification.

Figure 4:
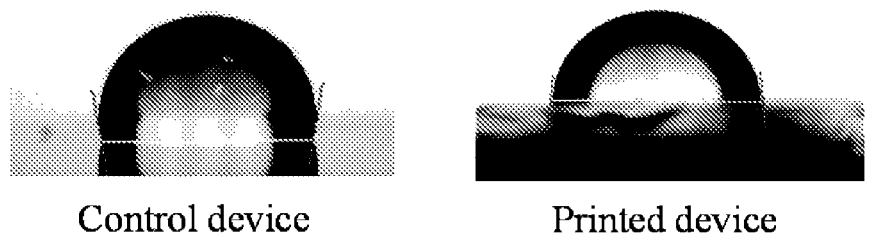

FIG. 4 shows contact angle measurements of P3HT:PCBM film spin coated and double stamp transfer printed on ITO/MoO$_3$ substrate, using water was the probing solvent. Vertical red bars are tangent to the contact angle. The scale bar indicates 1 mm.

Figure 5:
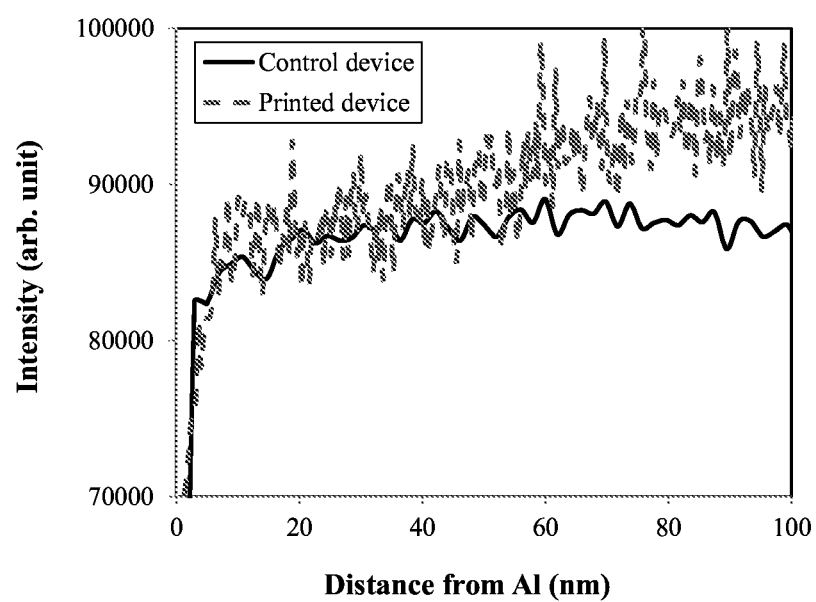
Figure 5:

FIG. 5 shows time of flight secondary ion mass spectrometry depth profiles of the S$^-$ ion (characteristic of P3HT) of spin coated and double stamp transfer printed P3HT:PCBM active layers versus the distance from P3HT:PCBM/Al interface.

Figure 6:
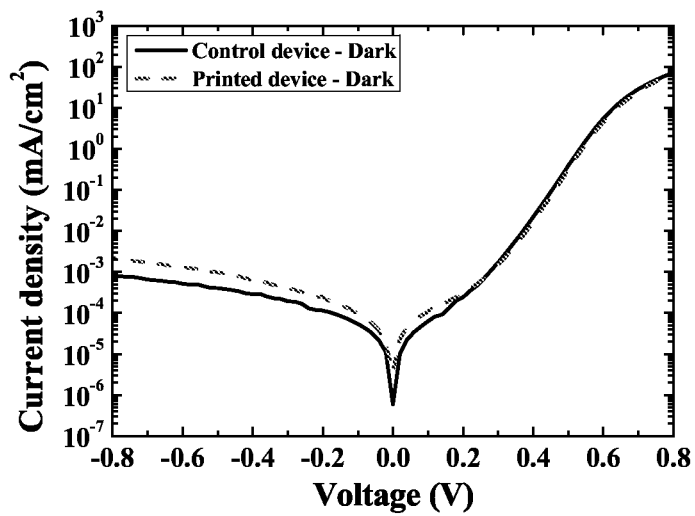
Figure 6:
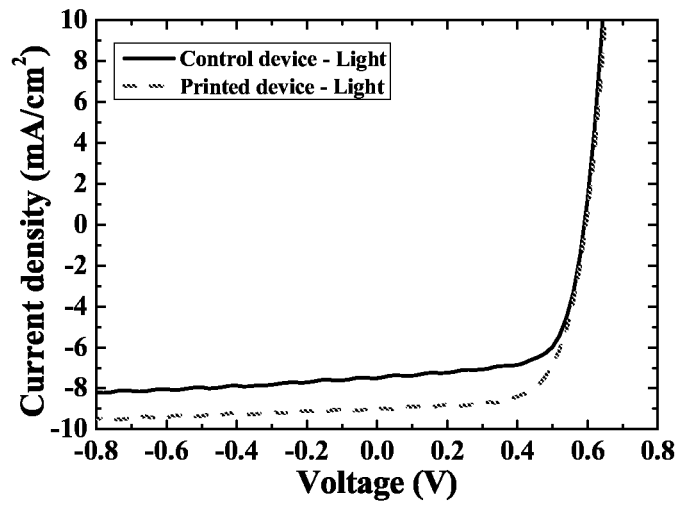

FIG. 6 shows current density-voltage curves of spin coated (control device) and double stamp transfer printed (printed device) devices under (a) dark and (b) AM 1.5 G light illumination condition.

Figure 7:
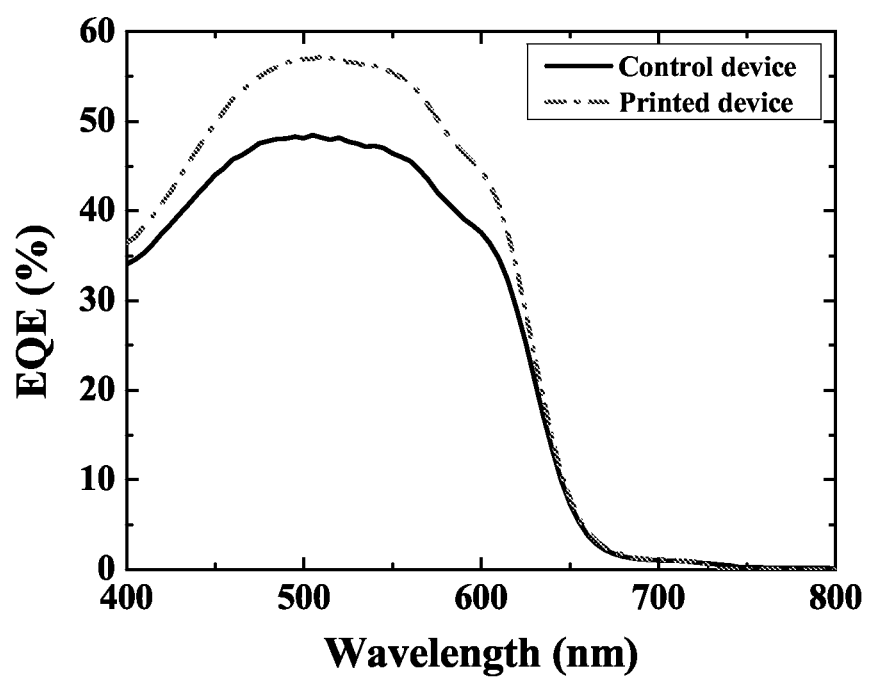

FIG. 7 shows external quantum efficiency vs. wavelength of spin coated (control device) and double stamp transfer printed (printed device) devices indicating the improved charge collection efficiency of the latter structure.

In the context of the organic materials of the present disclosure, the terms "donor" and "acceptor" refer to the relative positions of the Highest Occupied Molecular Orbital (HOMO) and Lowest Unoccupied Molecular Orbital (LUMO) energy levels of two contacting but different organic materials. If the LUMO energy level of one material in contact with another is further from the vacuum level, then that material is an acceptor. Otherwise it is a donor. It is energetically favorable, in the absence of an external bias, for electrons at a donor-acceptor junction to move into the acceptor material, and for holes to move into the donor material.

As used herein to describe an organic active layer, the term "compositionally graded" refers to a donor-acceptor concentration gradient normal to the substrate surface, wherein (1) the concentration of the donor material in the active layer is higher at the substrate surface and the concentration of the acceptor material is higher at a surface opposite to the substrate surface; or (2) the concentration of the acceptor material in the active layer is higher at the substrate surface and the concentration of the donor material is higher at a surface opposite to the substrate surface The present disclosure includes a single-stamp transfer printing process and a double-stamp transfer printing process for fabricating organic photosensitive optoelectronic devices having a compositionally graded organic active layer.

Figure 1:
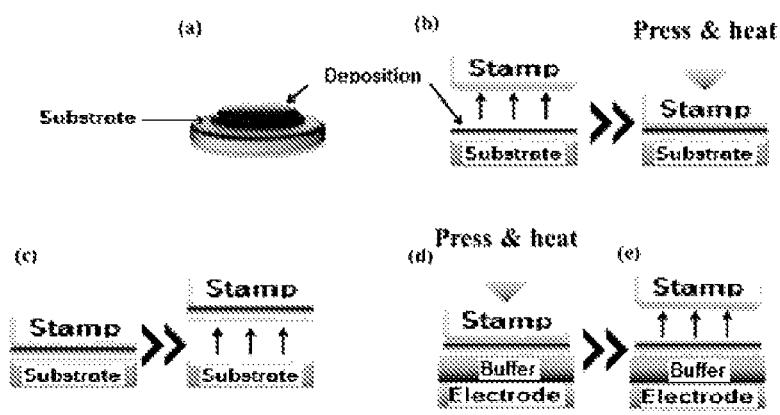
FIG. 1 shows the device fabrication sequence using the single stamp transfer printing technique.

As shown in FIG. 1, and in accordance with the present disclosure, the single-stamp transfer process for fabricating an organic photosensitive optoelectronic device comprises providing a compositionally graded organic active layer disposed on a substrate, wherein the organic active layer comprises at least one donor material and at least one acceptor material and has an exposed surface; contacting a stamp with the exposed surface of the active layer under conditions sufficient to attach the stamp to the exposed surface of the active layer; separating the active layer from the substrate using the stamp, wherein the separation exposes a lifted-off surface of the active layer; contacting the lifted-off surface of the active layer with a device layer under conditions sufficient to attach the active layer to the device layer; and separating the active layer from the stamp.

In some embodiments, the step of providing a compositionally graded organic active layer disposed on a substrate surface comprises depositing the organic active layer on the substrate surface, wherein the substrate surface is hydrophilic and the at least one donor material and the at least one acceptor material are chosen such that (1) one of the materials is hydrophilic and the other of the materials is hydrophobic; (2) one of the materials is sufficiently more hydrophilic than the other of the materials; or (3) one of the materials is sufficiently less hydrophobic than the other of the materials. Where one of the materials is hydrophilic and the other of the materials is hydrophobic, the concentration of the hydrophilic material will be higher near the hydrophilic substrate surface. If both materials are hydrophilic, the material that is sufficiently more hydrophilic will be more highly concentrated at the hydrophilic substrate surface. If both materials are hydrophobic, the material that is sufficiently less hydrophobic will be more highly concentrated at the hydrophilic substrate surface. The resulting active layer is therefore compositionally graded.

In other embodiments, the step of providing a compositionally graded organic active layer disposed on a substrate surface comprises depositing the organic active layer on the substrate surface, wherein the substrate surface is hydrophobic and the at least one donor material and the at least one acceptor material are chosen such that (1) one of the materials is hydrophobic and the other of the materials is hydrophilic; (2) one of the materials is sufficiently more hydrophobic than the other of the materials; or (3) one of the materials is sufficiently less hydrophilic than the other of the materials. Where one of the materials is hydrophobic and the other of the materials is hydrophilic, the concentration of the hydrophobic material will be higher near the hydrophobic substrate surface. If both materials are hydrophobic, the material that is sufficiently more hydrophobic will be more highly concentrated at the hydrophobic substrate surface. If both materials are hydrophilic, the material that is sufficiently less hydrophilic will be more highly concentrated at the hydrophobic substrate surface. The resulting active layer is therefore compositionally graded.

Thus, the substrate on which the compositionally graded organic active layer is disposed may be any substrate capable of both supporting a deposited active layer and inducing a concentration gradient, e.g., by having either a hydrophilic or hydrophobic surface. In one embodiment, the substrate is a Si wafer. In another embodiment, the substrate is glass. As will be appreciated by one of skill in the art, surface treatments can vary the surface energy of a material. For example, treating the surface of a Si wafer with ultra-violet ozone may result in a Si wafer having a hydrophilic surface. Thus, in some embodiments, the substrate surface is treated prior to depositing the organic active layer. In certain embodiments, the substrate surface is hydrophilic after treatment. In other embodiments, the substrate surface is hydrophobic after treatment. In certain embodiments, the surface treatment is chosen from ultra-violet ozone ($UV/O_3$) and plasma, such as oxygen and argon plasma. In some embodiments, a self-assembled monolayer is added to the substrate surface. In certain embodiments, the substrate surface is hydrophilic after adding a self-assembled monolayer. In other embodiments, the substrate surface is hydrophobic after adding a self-assembled monolayer.

The organic active layer may be deposited on the substrate surface according to methods known in the art. In some embodiments, the organic active layer is deposited by spin coating. In other embodiments, the organic active layer is deposited by bar coating, slit coating, slot coating, blade coating, or screen printing.

The at least one donor material and the at least one acceptor material may be chosen according to the definition of "donor" and "acceptor" provided herein. In some embodiments, one or both of the donor and acceptor materials are polymeric. In some embodiments, one or both of the donor and acceptor materials are small molecule materials. In some embodiments, at least one of the donor and acceptor materials is polymeric. In some embodiments, at least one of the donor and acceptor materials is a small molecule material. In some embodiments, the donor material is polymeric. In some embodiments, neither of the donor and acceptor materials are small molecule materials. As discussed above, the at least one donor material and the at least one acceptor material may be chosen such that one is hydrophilic and the other is hydrophobic, or otherwise chosen to have differing degrees of hydrophilicity or hydrophobicity.

Example donor materials include but are not limited to phthalocyanines, such as copper phthalocyanine(CuPc), chloroaluminium phthalocyanine (ClAlPc), tin phthalocyanine (SnPc), zinc phthalocyanine (ZnPc), and other modified phthalocyanines, subphthalocyanines, such as boron subphthalocyanine (SubPc), naphthalocyanines, merocyanine dyes, boron-dipyrromethene (BODIPY) dyes, thiophenes, such as poly(3-hexylthiophene) (P3HT), low band-gap polymers, polyacenes, such as pentacene and tetracene, diindenoperylene (DIP), squaraine (SQ) dyes, tetraphenyldibenzoperiflanthene (DBP), and derivatives thereof. Examples of squaraine donor materials include but are not limited to 2,4-bis [4-(N,N-dipropylamino)-2,6-dihydroxyphenyl] squaraine, 2,4-bis[4-(N,Ndiisobutylamino)-2,6-dihydroxyphenyl] squaraine, 2,4-bis[4-(N,N-diphenylamino)-2,6-dihydroxyphenyl] squaraine (DPSQ).

Example acceptor materials include but are not limited to subphthalocyanines, subnaphthalocyanines, dipyrrin complexes, such as zinc dipyrrin complexes, BODIPY complexes, perylenes, naphthalenes, fullerenes and fullerene derivatives (e.g., PCBMs, ICBA, ICMA, etc.), and polymers, such as carbonyl substituted polythiophenes, cyano-substituted polythiophenes, polyphenylenevinylenes, or polymers containing electron deficient monomers, such as perylene diimide, benzothiadiazole or fullerene polymers. Non-limiting mention is made to those chosen from $C_{60}$, $C_{70}$, $C_{76}$, $C_{82}$, $C_{84}$, or derivatives thereof such as Phenyl-$C_{61}$-Butyric-Acid-Methyl Ester ([60]PCBM), Phenyl-$C_{71}$-Butyric-Acid-Methyl Ester ([70]PCBM), or Thienyl-$C_{61}$-Butyric-Acid-Methyl Ester ([60]ThCBM), and other acceptors such as 3,4,9,10-perylenetetracarboxylic-bisbenzimidazole (PTCBI), hexadecafluorophthalocyanine ($F_{16}CuPc$), and derivatives thereof.

Example donor and acceptor materials are provided with the understanding that appropriate materials can be selected in accordance with the features and embodiments of the present disclosure. In some embodiments, for example, the acceptor material is PCBM, which is hydrophilic. In some embodiments, the donor material is P3HT, which is hydrophobic. In certain embodiments, the acceptor material is PCBM and the donor material is P3HT. Suitable exemplary donor material and acceptor material combinations are as follows: P3HT:$PC_{71}BM$, Benzo[1,2-b:4,5-b0]dithiophene (BDT) derived polymers:PCBM or $PC_{71}BM$, Dithieno[3,2-b:2',3'-d]silole (DTS) derived polymers:PCBM or $PC_{71}BM$, Cyclopenta[2,1-b:3,4-b']dithiophene (CPDT) derived polymers:PCBM or $PC_{71}BM$.

As one of ordinary skill in the art will understand from the present disclosure, the substrate and donor and acceptor materials may be chosen in order to achieve a desired orientation of donor and acceptor materials in the compositionally graded active layer.

As described above, the single-stamp transfer process includes contacting a stamp with the exposed surface of the active layer. The stamp may comprise any material capable of receiving the active layer. In some embodiments, the stamp comprises a polymer material. In certain embodiments, the stamp comprises polydimethylsiloxane (PDMS). In other embodiments, the stamp comprises polyurethane.

The step of contacting a stamp with the exposed surface of the active layer should be performed under conditions sufficient to attach the stamp to the exposed surface of the active layer. For example, in some embodiments, the conditions comprise contacting the stamp with the exposed surface using manual pressure. In other embodiments, mechanical means may be used to apply constant pressure. In certain embodiments, the stamp is pressed on the exposed surface of the active layer at room temperature, while in other embodiments it is pressed at a temperature above room temperature, such as at about 120° C. The amount of time that the stamp is contacted with or pressed on the exposed surface of the active layer may also be varied as appropriate. In certain embodiments, the stamp is contacted or pressed for about 10 seconds. In certain embodiments, the stamp is contacted or pressed at about 120° C. for about 10 seconds using manual pressure.

As described above, the single-stamp transfer process also includes separating the active layer from the substrate using the stamp. In certain embodiments, mechanical means may be used to apply constant pulling force to separate the active layer from the substrate. In other embodiments, manual pulling force may be used to separate the active layer from the substrate. The separation step exposes a lifted-off surface of the active layer. The lifted-off surface of the active layer is then contacted with a device layer under conditions sufficient to attach the active layer to the device layer. The conditions used may be the same as or different than the conditions described above. As before, the degree of pressure, e.g., manual pressure, the temperature, e.g., room temperature or elevated temperature, and the length of contact time, may be varied as appropriate. The active layer is then separated from the stamp. In certain embodiments, the active layer and device layer are then optionally annealed.

Thus, the organic active layer is left disposed on the device layer for preparation of an organic photosensitive optoelectronic device. For example, additional layers can then be deposited over the organic active layer, such as buffer layers and/or an electrode. The device may form a subcell upon the addition of layers over the organic active layer for use in a tandem device. For example, the stamp transfer printing processes disclosed herein may be used again to provide an organic active layer for a second subcell on top of a first subcell, as in a tandem device.

The device layer may be any layer in an organic photosensitive optoelectronic device suitable for receiving an organic active layer. For example, the device layer may be an electrode, which may also serve as the device substrate, such as an indium tin oxide (ITO) coated substrate (e.g., ITO coated glass). In other embodiments, the device layer is a device buffer layer, such as a blocking layer or a charge collecting layer. In certain embodiments, the device layer is a charge collecting layer comprising a material chosen from metal oxides. In certain embodiments, the metal oxides are chosen from $MoO_3$, $V_2O_5$, ZnO, and $TiO_2$.

As a person of ordinary skill in the art will understand, the process should be designed such that the donor-acceptor orientation of the compositionally graded organic active layer is suitable for the device layer onto which the active layer is pressed. For example, those of ordinary skill in the art will understand that the donor-rich side of the active layer should be oriented near the anode-side of the device, and the acceptor-rich side of the active layer should be oriented near the cathode-side of the device. Accordingly, it should be understood that donor and acceptor materials and the substrate surface may be chosen or designed to produce a suitable donor-acceptor orientation for stamping onto a desired device.

In some instances, depending on material availability and selection and the desired device configuration, it may be appropriate to perform a double-stamp transfer printing process as described herein. The double-stamp transfer printing process of the present disclosure is similar to the single-stamp process, except that an intermediate step is performed to transfer the organic active layer from a first stamp to a second stamp.

In accordance with the present disclosure, the double-stamp transfer printing process for fabricating an organic photosensitive optoelectronic device comprises providing a compositionally graded organic active layer disposed on a substrate surface, wherein the organic active layer comprises at least one donor material and at least one acceptor material and has an exposed surface; contacting a first stamp with the exposed surface of the active layer under conditions sufficient to attach the first stamp to the exposed surface of the active layer; separating the active layer from the substrate using the first stamp, wherein the separation from the substrate exposes a first lifted-off surface of the active layer; contacting a second stamp with the first lifted-off surface of the active layer under conditions sufficient to attach the second stamp to the first-lifted-off surface of the active layer; separating the active layer from the first stamp using the second stamp, wherein the separation from the first stamp exposes a second lifted-off surface of the active layer; contacting the second lifted-off surface of the active layer with a device layer under conditions sufficient to attach the active layer to the device layer; and separating the active layer from the second stamp.

Figure 2:
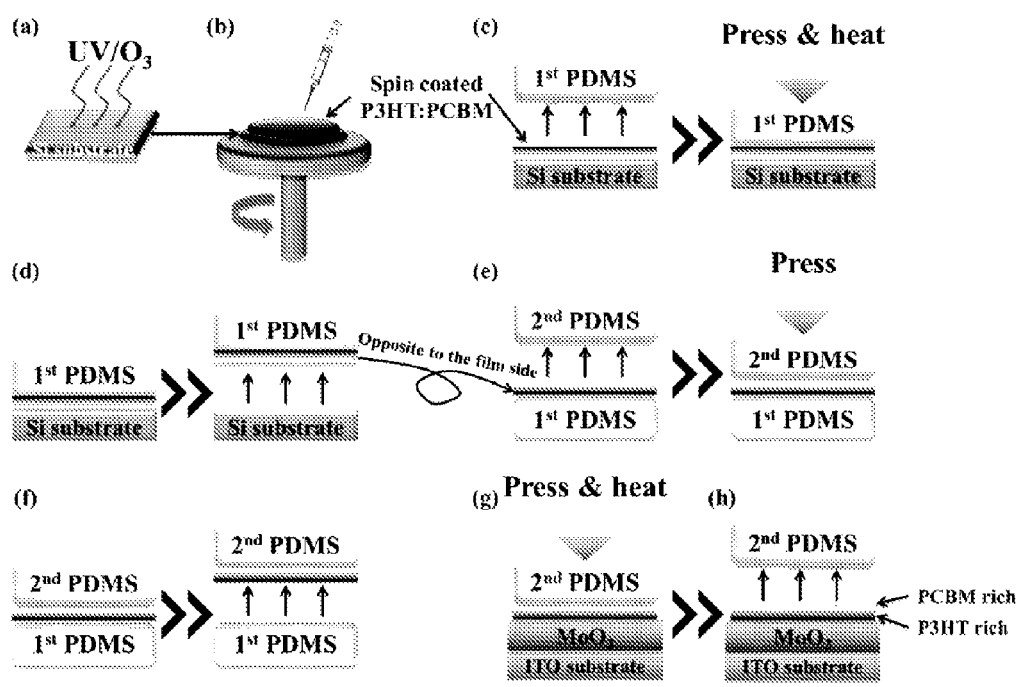
FIG. 2 shows the device fabrication sequence of P3HT:PCBM polymer solar cells using the double stamp transfer printing technique.

An example of the double-stamp transfer printing process is shown in FIG. 2. This figure includes specific materials in order to illustrate an example of the design considerations of the present disclosure. It should be understood that the specific process shown is only a particular embodiment, and that the process may be carried out using various materials based on the desired design considerations as described above.

In the double-stamp process, the step of providing a compositionally graded organic active layer disposed on a substrate surface may be carried out as described above for the single-stamp process. Similarly, the substrate and donor and acceptor materials may be chosen as described above.

In addition, the step of contacting a first stamp with the exposed surface of the active layer under conditions sufficient to attach the first stamp to the exposed surface of the active layer, and the step of separating the active layer from the substrate using the first stamp may be performed as described above in the single-stamp process for contacting the stamp with the exposed surface of the active layer and separating the active layer from the substrate using the stamp, respectively.

In the double-stamp process, after separating the active layer from the substrate using the first stamp a first lifted-off surface of the active layer is exposed. A second stamp is then contacted with the first lifted-off surface of the active layer under conditions sufficient to attach the second stamp to the first-lifted-off surface of the active layer. In some embodiments, the conditions comprise contacting the second stamp with the first lifted-off exposed surface using manual pressure. As before, the degree of pressure, e.g., manual pressure, the temperature, e.g., room temperature or elevated temperature, and the length of contact time, may be varied as appropriate.

The second stamp may comprise any material capable of receiving the active layer from the first stamp. In some embodiments, the second stamp comprises a polymer material. In some embodiments, the second stamp comprises the same material as the first stamp. In some embodiments, the first and second stamps comprise different materials. In certain embodiments, the second stamp comprises polydimethylsiloxane (PDMS). In certain embodiments, the first and second stamps comprise PDMS.

The active layer is then separated from the first stamp using the second stamp, which completes the transfer of the active layer from the first stamp to the second stamp. In some embodiments, mechanical means may be used to apply constant pulling force to separate the active layer from the first stamp. In other embodiments, manual pulling force may be used to separate the active layer from the first stamp. The separation from the first stamp exposes a second lifted-off surface of the active layer. The second lifted-off surface of the active layer is then contacted with a device layer under conditions sufficient to attach the active layer to the device layer. As before, the degree of pressure, e.g., manual pressure, the temperature, e.g., room temperature or elevated temperature, and the length of contact time, may be varied as appropriate. For example, in some embodiments, the conditions comprise contacting the second lifted-off surface with the device layer using manual pressure. In certain embodiments, the lifted-off surface is pressed on the device layer at room temperature, while in other embodiments it is pressed at a temperature above room temperature, such as at about 120° C. In certain embodiments, the second lifted-off surface is pressed on the device layer for about 10 seconds. In certain embodiments, the second-lifted off surface is pressed at about 120° C. for about 10 seconds using manual pressure. The active layer is then separated from the second stamp. In certain embodiments, the active layer and device layer are then optionally annealed.

Thus, the organic active layer is left disposed on the device layer for preparation of an organic photosensitive optoelectronic device. For example, as discussed above, additional layers can then be deposited over the organic active layer.

The device layer may be any layer in an organic photosensitive optoelectronic device suitable for receiving an organic active layer. For example, the device layer may be an electrode (such as an anode or cathode), which may also serve as the device substrate, such as an indium tin oxide (ITO) coated substrate (e.g., ITO coated glass). In other embodiments, the device layer is a device buffer layer, such as a blocking layer or a charge collecting layer. In certain embodiments, the device layer is a charge collecting layer comprising a material chosen from metal oxides. In certain embodiments, the metal oxides are chosen from $MoO_3$, $V_2O_5$, ZnO, and $TiO_2$.

As before, a person of ordinary skill in the art will understand that the process should be designed such that the donor-acceptor orientation of the compositionally graded organic active layer is suitable for the device layer onto which the active layer is pressed. For example, those of ordinary skill in the art will understand that the donor-rich side of the active layer should be oriented near the anode-side of the device, and the acceptor-rich side of the active layer should be oriented near the cathode-side of the device. Accordingly, it should be understood that donor and acceptor materials and the substrate surface may be chosen or designed to produce a suitable donor-acceptor orientation for stamping onto a desired device.

The organic photosensitive optoelectronic devices of the present disclosure may be, for example, photodetectors, photoconductors, or photovoltaics, such as solar cells.

It should be understood that the methods described herein may be used to fabricate a wide variety of device structures. Materials other than those specifically described may be used. The names given to the various layers herein are not intended to be strictly limiting.

Other than in the examples, or where otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, may inherently contains certain errors necessarily resulting from the standard deviation found in their respective testing measurements.

The devices and methods described herein will be further described by the following non-limiting examples, which are intended to be purely exemplary.

EXAMPLES

A printed device was fabricated in accordance with the present disclosure having the structure: indium tin oxide (ITO, 50 nm)/$MoO_3$ (10 nm)/P3HT:PCBM (1:0.7, 120 nm)/Ca (20 nm)/Al(200 nm). The P3HT:PCBM active layer was stamp transfer-printed on $MoO_3$ using a polydimethylsiloxane (PDMS) stamp with an active area of 100 $mm^2$. The PDMS stamp was fabricated by curing Sylgard® 184 from Dow Corning Co. at 95° C. for 2 hr. FIG. 2 shows the device fabrication sequence of P3HT:PCBM polymer solar cells using the double stamp transfer printing technique. The stamp transfer printing was carried out using the following steps: (i) Ultraviolet (UV)/$O_3$ treatment of Si wafer; (ii) Spin coating of P3HT:PCBM (dissolved at 4% concentration in cholorbenzene) active layer on Si wafer at a spin speed of 2000 rpm for 30 s; (iii) Contact of PDMS stamp handle with P3HT:PCBM active layer at 120° C. for 10 s under manual pressure; (iv) Separation of P3HT:PCBM active layer from Si using the PDMS stamp; (v) Intimate contact of a second PDMS stamp to the P3HT:PCBM active layer held on the first stamp followed by the transfer of the P3HT:PCBM active layer to the second PDMS stamp; (vi) Intimate contact of the second stamp with a $MoO_3$ and ITO coated glass substrate at 120° C. for 10 s at a manual pressure. This effects the transfer of P3HT:PCBM from the second stamp to the ITO; (vii) Anneal at 120° C. for 10 min. An identical polymer OPV fabricated by spin coating at 2000 rpm for 30 s, followed by curing at 120° C. for 10 min was also prepared as a control device.

The polymer OPV performance was measured using a solar simulator with a Xe lamp using AM 1.5 G filters and a National Renewable Energy Laboratory calibrated standard Si detector. X-ray photoelectron spectrometry (XPS) was used to analyze the vertical compositional gradient of the P3HT:PCBM layer (Kratos Axis Ultra XPS with monochromated Al Kα X-ray source). Time of flight secondary ion mass spectrometry (TOF-SIMS) depth profiles of the double stamp transfer printed film were obtained using a TOFSIMS5 (Iontof Inc.) equipped with Cs+ ion beam.

Spin coating of the P3HT:PCBM active layer was carried out on the UV/O$_3^-$ treated surface of a Si wafer to result in a compositionally graded active layer normal to the wafer surface. Since PCBM is hydrophilic and P3HT is hydrophobic, spin coating the mixture on Si resulted in a gradient with the PCBM concentration higher near the Si surface. Therefore, double transfer-printing of P3HT:PCBM on MoO$_3$ created a P3HT-rich active layer at the interface with MoO$_3$, and a PCBM-rich composition at the interface with the Ca/Al cathode. Although the process conditions were different for control and stamp-printed devices, the thickness of the spin coated control and stamp transfer printed devices was similar at 120±5 nm.

Figure 3:
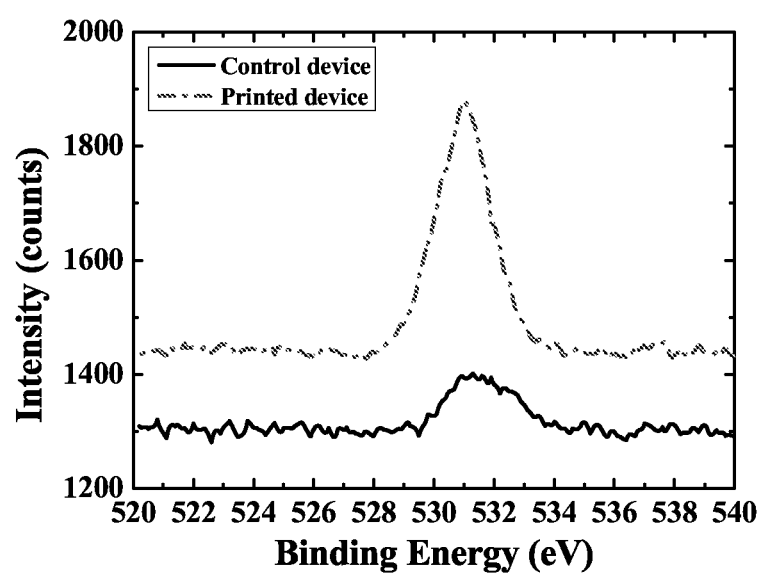
FIG. 3 shows x-ray photoelectron spectra of P3HT:PCBM film spin coated (control device) and double stamp transfer printed (printed device) on an ITO/MoO$_3$ coated glass substrate.

The graded P3HT:PCBM active layer composition was confirmed by XPS analysis of the O$_{1s}$ species concentration (characteristic of PCBM) at the surface. FIG. 3 shows XPS spectra of the P3HT:PCBM active layer spin-coated (control device) and double stamp transfer printed (printed device) on an ITO/MoO$_3$ coated glass substrate. The O$_{1s}$ peak intensity at 531 eV was considerably higher in the stamp-transferred film compared to the spin-coated film, indicating that the relative content of PCBM at the interface with the cathode was high in the stamp transfer printed film. By this means, electron collection at the cathode was improved.

The composition gradient was further investigated by contact angle measurements (FIG. 4). FIG. 4 shows contact angle measurements of P3HT:PCBM film spin coated and double stamp transfer printed on a ITO/MoO$_3$ substrate using water as the probing solvent. Vertical red bars are tangent to the contact angle. The scale bar indicates 1 mm. The contact angle of the stamp-transferred film was 87° at the interface with Ca/Al, while that of the spin coated device was 101°. These data suggest that the hydrophilic PCBM was concentrated near the Ca/Al interface of the stamp transfer printed device, which supports the existence of a PCBM rich composition at the interface with Ca/Al in the stamp transfer printed device compared with the spin coated control. Note that while thermal annealing can also result in compositional gradients, all of the measurements were carried out after annealing. Indeed, measuring the contact angle before and after annealing did not noticeably change the contact angle. The vertical compositional gradient was induced during spin coating by its surface energy with the Si substrate.

Finally, the gradient of the stamp-transferred device was investigated by TOF-SIMS. FIG. 5 shows the time of flight secondary ion mass spectroscopy depth profiles of the S− ion (characteristic of P3HT) of spin coated and double stamp transfer printed P3HT:PCBM active layers versus the distance from P3HT:PCBM/Al interface, from which the P3HT depth profile was inferred, once more indicating a P3HT-rich composition at the interface with MoO$_3$. In contrast, the S− intensity remains constant throughout the P3HT:PCBM layer in the spin-coated sample. Therefore, a composition gradient of the P3HT resulted from the stamp transfer printing process.

The current density-voltage (J-V) characteristics of the control and stamp-transferred P3HT:PCBM polymer OPVs are compared in FIG. 6. FIG. 6 shows current density-voltage curves of spin coated (control device) and double stamp transfer printed (printed device) devices under (a) dark and (b) AM 1.5 G light illumination conditions. Note that the dark current of the printed devices was decreased compared to the control due to efficient electron and hole blocking resulting from the concentration gradient achieved by printing. There was little change in the open circuit voltage (V$_{OC}$) between the two devices. The dark current density was also unaffected by the composition gradient.

The photocurrent density was also higher for the stamp-transfer printed device relative to the control. The short circuit current density of the printed device was J$_{sc}$=8.9±0.1 mA/cm$^2$ compared with J$_{sc}$=7.6±0.1 mA/cm$^2$ for the control, corresponding to a 19% increase. Here, errors quoted are based on testing 3 similarly processed devices. As anticipated, the high J$_{sc}$ of the printed device was due to improved charge collection at the electrodes. The open circuit voltage of polymer OPVs was independent of the film forming process since it primarily depends on the energy level alignments between P3HT and PCBM, and is indicative of the absence of significant differences in the interface recombination rates for the two structures. Finally the fill factor was also unaffected by the deposition process. Taking all parameters into account, the efficiency of P3HT:PCBM polymer OPVs increased from PCE=3.0±0.2% to 3.7±0.2% using stamp transfer printing. Device operating characteristics are summarized in Table 1.

The external quantum efficiencies (EQE) of the P3HT:PCBM OPVs are shown in FIG. 7. FIG. 7 shows external quantum efficiency versus wavelength of the spin coated (control device) and double stamp transfer printed (printed device) devices indicating the improved charge collection efficiency of the latter structure. The EQE of the P3HT:PCBM stamp-transfer device was increased over the entire wavelength range spanned by absorption in the two active materials compared with the control. This was a further indication that charge collection at the electrodes was improved by the concentration gradient that resulted from the transfer process.

A graded P3HT:PCBM active layer was therefore achieved by double stamp-transfer printing originating on the hydrophilic surface of a Si wafer, and then transferred by a second stamp to the ITO-coated glass substrate used for the OPV. The printing process resulted in a P3HT-rich interface with MoO$_3$ and a PCBM-rich interface with the Ca/Al cathode. The graded layer led to an increase in the power conversion efficiency of P3HT:PCBM polymer OPVs by 23% to a maximum value of 3.7±0.2%, mostly due to the increase in charge collection at the contacts and hence an increased J$_{sc}$.

TABLE 1

Performance characteristics of P3HT:PCBM polymer solar cells.

| Device | J$_{SC}$ (mA/cm$^2$) | V$_{OC}$ (V) | FF (%) | PCE (%) |
|---|---|---|---|---|
| Control | 7.6 ± 0.1 | 0.59 ± 0.01 | 67 ± 2 | 3.0 ± 0.2 |
| Transfer-Printed | 8.9 ± 0.1 | 0.60 ± 0.01 | 69 ± 1 | 3.7 ± 0.2 |

What is claimed is:

1. A process for fabricating an organic photosensitive optoelectronic device, comprising:
   providing a compositionally graded organic active layer disposed on a substrate surface, wherein the organic active layer comprises at least one donor material and at least one acceptor material and has an exposed surface;
   contacting a stamp with the exposed surface of the active layer under conditions sufficient to attach the stamp to the exposed surface of the active layer;
   separating the active layer from the substrate using the stamp, wherein the separation exposes a lifted-off surface of the active layer;

contacting the lifted-off surface of the active layer with a device layer under conditions sufficient to attach the active layer to the device layer; and separating the active layer from the stamp.

2. The method of claim 1, wherein the step of providing a compositionally graded organic active layer disposed on a substrate surface comprises depositing the organic active layer on the substrate surface, wherein the substrate surface is hydrophilic and the at least one donor material and the at least one acceptor material are chosen such that (1) one of the materials is hydrophilic and the other of the materials is hydrophobic; (2) one of the materials is sufficiently more hydrophilic than the other of the materials; or (3) one of the materials is sufficiently less hydrophobic than the other of the materials.

3. The method of claim 1, wherein the step of providing a compositionally graded organic active layer disposed on a substrate surface comprises depositing the organic active layer on the substrate surface, wherein the substrate surface is hydrophobic and the at least one donor material and the at least one acceptor material are chosen such that (1) one of the materials is hydrophobic and the other of the materials is hydrophilic; (2) one of the materials is sufficiently more hydrophobic than the other of the materials; or (3) one of the materials is sufficiently less hydrophilic than the other of the materials.

4. The method of claim 1, wherein the substrate is a Si wafer.

5. The method of claim 2, further comprising treating the substrate surface with a surface treatment prior to depositing the organic active layer, wherein the substrate surface is hydrophilic after treatment.

6. The method of claim 5, wherein the surface treatment is chosen from ultra-violet ozone (UV-$O_3$) and oxygen plasma.

7. The method of claim 1, wherein the step of providing a compositionally graded organic active layer disposed on a substrate surface comprises depositing the organic active layer on the substrate surface by spin coating.

8. The method of claim 1, wherein at least one of the donor material and the acceptor material is polymeric.

9. The method of claim 1, wherein at least one of the donor material and the acceptor material is a small molecule material.

10. The method of claim 1, wherein the acceptor material is PCBM.

11. The method of claim 1, wherein the donor material is P3HT.

12. The method of claim 1, wherein the acceptor material is PCBM and the donor material is P3HT.

13. The method of claim 1, wherein the stamp comprises a polymer material.

14. The method of claim 13, wherein the stamp comprises a material chosen from polydimethylsiloxane (PDMS) and polyurethane.

15. The method of claim 1, wherein the device layer is an electrode.

16. The method of claim 1, wherein the device layer is a device buffer layer.

17. The method of claim 16, wherein the device buffer layer is a charge collecting layer comprising a material chosen from metal oxides.

18. The method of claim 17, wherein the metal oxides are chosen from $MoO_3$, $V_2O_5$, ZnO, and $TiO_2$.

19. A process for fabricating an organic photosensitive optoelectronic device, comprising:

providing a compositionally graded organic active layer disposed on a substrate surface, wherein the organic active layer comprises at least one donor material and at least one acceptor material and has an exposed surface;

contacting a first stamp with the exposed surface of the active layer under conditions sufficient to attach the first stamp to the exposed surface of the active layer;

separating the active layer from the substrate using the first stamp, wherein the separation from the substrate exposes a first lifted-off surface of the active layer;

contacting a second stamp with the first lifted-off surface of the active layer under conditions sufficient to attach the second stamp to the first-lifted-off surface of the active layer;

separating the active layer from the first stamp using the second stamp, wherein the separation from the first stamp exposes a second lifted-off surface of the active layer;

contacting the second lifted-off surface of the active layer with a device layer under conditions sufficient to attach the active layer to the device layer; and separating the active layer from the second stamp.

20. The method of claim 19, wherein the step of providing a compositionally graded organic active layer disposed on a substrate surface comprises depositing the organic active layer on the substrate surface, wherein the substrate surface is hydrophilic and the at least one donor material and the at least one acceptor material are chosen such that (1) one of the materials is hydrophilic and the other of the materials is hydrophobic; (2) one of the materials is sufficiently more hydrophilic than the other of the materials; or (3) one of the materials is sufficiently less hydrophobic than the other of the materials.

21. The method of claim 19, wherein the step of providing a compositionally graded organic active layer disposed on a substrate surface comprises depositing the organic active layer on the substrate surface, wherein the substrate surface is hydrophobic and the at least one donor material and the at least one acceptor material are chosen such that (1) one of the materials is hydrophobic and the other of the materials is hydrophilic; (2) one of the materials is sufficiently more hydrophobic than the other of the materials; or (3) one of the materials is sufficiently less hydrophilic than the other of the materials.

22. The method of claim 19, wherein the substrate is a Si wafer.

23. The method of claim 20, further comprising treating the substrate surface with a surface treatment prior to depositing the organic active layer, wherein the substrate surface is hydrophilic after treatment.

24. The method of claim 23, wherein the surface treatment is chosen from ultra-violet ozone (UV-$O_3$) and oxygen plasma.

25. The method of claim 19, wherein the step of providing a compositionally graded organic active layer disposed on a substrate surface comprises depositing the organic active layer on the substrate surface by spin coating.

26. The method of claim 19, wherein at least one of the donor material and the acceptor material is polymeric.

27. The method of claim 19, wherein at least one of the donor material and the acceptor material is a small molecule material.

28. The method of claim 19, wherein the acceptor material is PCBM.

29. The method of claim 19, wherein the donor material is P3HT.

30. The method of claim 19, wherein the acceptor material is PCBM and the donor material is P3HT.

31. The method of claim 19, wherein the first stamp and the second stamp are independently chosen from polymer materials.

32. The method of claim 19, wherein the first and second stamps comprise polydimethylsiloxane (PDMS).

33. The method of claim 19, wherein the device layer is an electrode.

34. The method of claim 19, wherein the device layer is a device buffer layer.

35. The method of claim 34, wherein the device buffer layer is a charge collecting layer comprising a material chosen from metal oxides.

36. The method of claim 35, wherein the metal oxides are chosen from $MoO_3$, $V_2O_5$, ZnO, and $TiO_2$.

* * * * *